(12) United States Patent
Bommier

(10) Patent No.: US 6,993,060 B2
(45) Date of Patent: Jan. 31, 2006

(54) RESISTOR MADE FROM CARBONACEOUS MATERIAL

(75) Inventor: Christoph Bommier, Basking Ridge, NJ (US)

(73) Assignee: Carbone Lorraine Composants, Gennevilliers (FR)

( * ) Notice: Subject to any disclaimer, the term of this patent is extended or adjusted under 35 U.S.C. 154(b) by 0 days.

(21) Appl. No.: 10/505,709

(22) PCT Filed: Feb. 24, 2003

(86) PCT No.: PCT/EP03/02649

§ 371 (c)(1),
(2), (4) Date: Jan. 27, 2005

(87) PCT Pub. No.: WO03/073794

PCT Pub. Date: Sep. 4, 2003

(65) Prior Publication Data

US 2005/0120547 A1    Jun. 9, 2005

Related U.S. Application Data

(60) Provisional application No. 60/360,177, filed on Mar. 1, 2002.

(30) Foreign Application Priority Data

Feb. 27, 2002   (FR)   .................................. 02 02467

(51) Int. Cl.
*H05B 3/14*   (2006.01)

(52) U.S. Cl. ...................... 373/132; 219/553; 373/109; 373/134

(58) Field of Classification Search ........ 373/109–110, 373/117–119, 127, 132, 134; 219/535, 553; 338/22 R; 117/200, 217, 222
See application file for complete search history.

(56) References Cited

U.S. PATENT DOCUMENTS

| | | | | |
|---|---|---|---|---|
| 2,971,039 A | * | 2/1961 | Westeren | ..................... 373/128 |
| 3,359,077 A | * | 12/1967 | Arst | ............................ 117/217 |
| 3,786,165 A | | 1/1974 | Barbier et al. | |
| 4,410,796 A | * | 10/1983 | Wilsey | ........................ 373/132 |
| 4,533,822 A | | 8/1985 | Fujii et al. | |
| 4,549,345 A | | 10/1985 | Wilsey | |
| 4,755,658 A | | 7/1988 | Wilsey | |
| 5,660,752 A | | 8/1997 | Vilzmann | |
| 6,093,913 A | * | 7/2000 | Schrenker et al. | .......... 219/552 |
| 6,285,011 B1 | | 9/2001 | Cherko | |

FOREIGN PATENT DOCUMENTS

DE           3743879           7/1988

\* cited by examiner

*Primary Examiner*—Tu Hoang
(74) *Attorney, Agent, or Firm*—Dennison, Schultz, Dougherty & MacDonald

(57) ABSTRACT

A crenellated resistor made from a carbonaceous material and having the shape of a hollow cylinder for use in furnaces working at high temperature. The resistor is characterized by the thickness of the cylinder walls which follows a profile determined so as to produce an even temperature on the surface of the resistor when it is working. Thus, the wall has a radial thickness which decreases in a transition section from the peripheral edge to the internal edge. The resistor configuration allows elimination of hot spots which may appear when electricity flows through the resistor.

8 Claims, 5 Drawing Sheets

RESISTOR MADE FROM CARBONACEOUS MATERIAL

This application claims the benefit of Provisional App. No. 60/360,177, filed Mar. 1, 2002.

FIELD OF THE INVENTION

The invention relates to electric resistances used as heating elements, especially those used as a heat source in furnaces working at high temperature and generally called <<resistors>>. The invention particularly relates to such resistors made from carbonaceous materials.

DESCRIPTION OF RELATED ART

Electric resistances, or "resistors", are well known and commonly used as heating sources in furnaces working at high temperature. The materials used to make these resistances are selected according to various criteria such as, notably, the expected working temperature and the physico-chemical environment surrounding the resistances during use. For furnaces working at a temperature of roughly 1000° C. or above and in an oxygen free atmosphere, it is frequent to use resistances made with carbonaceous materials, such as graphite, carbon or some carbon/carbon composites (C/C composites). This choice is justified by several properties of these materials such as:

their ability to withstand high temperatures (up to 2800° C. for graphite) and/or frequent thermal cycles without undergoing any transformation or suffering from any loss of properties, electric resistivity values suitable for use in an electric resistance (especially graphite materials whose resistivities are typically in the 400 et 5000 $\mu\Omega$.cm range), a reasonable cost of production.

The electric resistances for furnaces can have different shapes and be assembled in different ways. For example, they can be axisymetrical (apart from the electrical connections), generally in the shape of a hollow cylinder (e.g. U.S. Pat. No. 5,660,752) or of two hollow cylinders of different diameters linked by a tapered connecting portion (e.g. U.S. Pat. No. 4,533,822). For brittle materials such as graphite and, to a lesser extent, the C/C composites, these resistances are made by assembling U-shaped sections (U.S. Pat. No. 3,786,165) or shell-like elements (DE 37 43 879, U.S. Pat. No. 4,549,345, U.S. Pat. No. 4,755,858, U.S. Pat. No. 5,660,752). U.S. Pat. No. 6,285,011 disclosed recently a one-piece almost cylindrical resistor made of carbonaceous material.

These resistors often have the form of a hollow cylinder whose wall comprises straight, alternated and regularly spaced slots, which form a continuous path with "crenellations" or meanders, also called "zig-zags", as illustrated in FIG. 1. Electricity passes along that path. This kind of resistor will hereafter be referred to as a "crenellated resistor".

The meander-like shape of crenellated resistors provides them with high mechanical strength, reduces the number of electric connections and forms an almost continuous wall which emits a very even thermal flux towards the inner space of the cylinder. The resistor disclosed by U.S. Pat. No. 6,285,011 is set out as a good compromise between economy of space, high mechanical strength and high heating power.

However, when in service, most crenellated resistors develop areas with pronounced temperature gradients (or <<hot spots>>) close to the extremities of each meander. These hot spots go against the temperature homogeneity in the inner space of the resistor and can, moreover, create some undesired thermal gradients on the articles undergoing a heat treatment in said inner space. In addition these hot spots are potentially highly reactive with the atmosphere surrounding the resistor, mostly because their temperature is higher than those found in the straight sections of the resistor. This higher reactivity could lead to accelerated physico-chemical transformations affecting some local areas of the resistor (as for instance an oxidation or a siliconization of the carbonaceous material). These transformations could affect the mechanical properties of the material in the most exposed areas (mechanical stresses are concentrated in the curved area). These phenomena accelerate the degradation and the wear of the resistors. For example, a crenellated resistor used for silicon crystal growing has a lifespan of only few months, rarely more than one year.

The inventor has tried to make a resistor for high temperature duties which allows an almost perfectly even temperature distribution in the working area, which would be free of the drawbacks known on the resistors according to the prior art, which would still have the main characteristics of crenellated resistors, which could have an improved lifespan and which would remain economically competitive.

SUMMARY OF THE INVENTION

The invention provides a crenellated resistor, i.e. a resistance with a hollow cylindrical shape and a meander like design, made from a carbonaceous material, and characterized in that the wall thickness varies in the extremities of the meanders—where the electrical lines are curved—in order to produce an even temperature on the surface of the resistor when in use.

The inventor worked on the hypothesis that the temperature gradients were due to a high concentration of the electrical flow lines—and therefore to an increase in the power dissipated per unit of surface area—in the part of the meander where the radius of the curve is the shortest. In this way, he tried to increase the electrical resistance in this area in order to distribute more evenly these electrical flow lines.

The inventor figured out that a modification of the wall thickness of the resistor determined so as to modify the electric current density. This modification was mode essentially in the extremities of the meanders where the electrical lines are curved and consisted in decreasing the wall thickness when the radius of the curved electrical line decreased. This idea allows to get an improved temperature homogeneity without any major impact on the mechanical characteristics of the resistor.

The invention is also aimed at the use of a crenellated resistor with its improved features into a furnace working at high temperature. This invention particularly relates to the use of a crenelated resistor according to the invention for the production of single crystals—or monocrystals—of silicon according to the Czochralski process (CZ furnaces). In particular, there is provided a furnace or oven comprising a crenellated resistor according to the invention.

The invention is particularly useful to pull silicon single crystals according to the Czochralski process. In this application the process releases a silica rich vapor which reacts with the reactor, especially in the hot spots, and creates a premature wear. Besides, this application requires an even heating inside the working area (i.e. in the inner space of the hollow resistor).

BRIEF DESCRIPTION OF THE DRAWINGS

The invention will be better understood with the support of the following figures and detailed description.

DESCRIPTION OF THE PREFERRED EMBODIMENT

Figure 1:
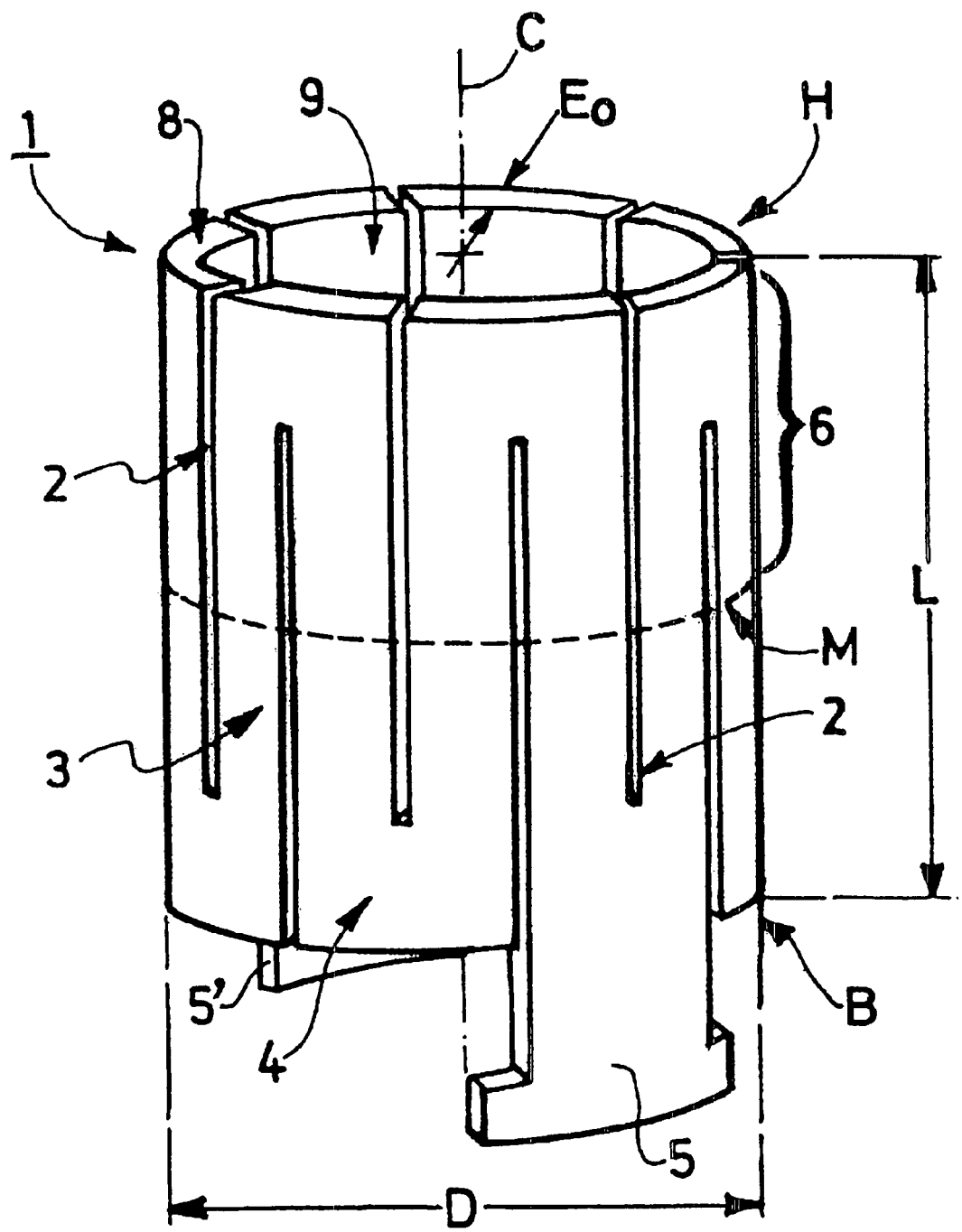
FIG. 1 gives a general view of a typical crenellated resistor of prior art.

As illustrated on the FIG. 1, a crenelated resistor (1), with the general shape of a cylinder, generally includes a plurality of straight slots (2), which are alternated and regularly spaced. The slots (2) emerge alternatively at each side (H and B) of the resistor, and this defines a path with meanders whose linear resistance is approximately even, at least in the straight portions (3). The turns of each meander form crenels (or crenellations or meander halves) (6), which will be hereafter referred to as "transition sections".

The crenellated resistor, with a cylindrical shape, determines an inside area (or inner space) (9) where the parts or products to be treated are loaded. The resistor according to the invention can be an assembly of several pieces, said pieces being for example linked together by parts used also for the electric connection. The crenellated resistor according to the invention can also be a one-piece hollow cylinder, as illustrated on the FIG. 1.

Generally, the crenellated resistor includes some electrical and/or mechanical connection means (5, 5') which typically comprise mere extensions of one or more transition sections.

The thickness of the wall of the crenellated resistor (1) according to prior art (and more precisely the radial thickness relatively to the C axis of the cylinder) Eo is essentially uniform or, like the resistor disclosed by U.S. Pat. No. 6,285,011, greater at the ends of its section (which is U-shaped or H-shaped).

The length L of a crenellated resistor is typically comprised between a few hundreds of millimeters and 1 meter or even 2 meters. Its diameter D is typically between 100 and 1000 mm. The wall thickness is typically between 5 and 40 mm.

Figure 2:
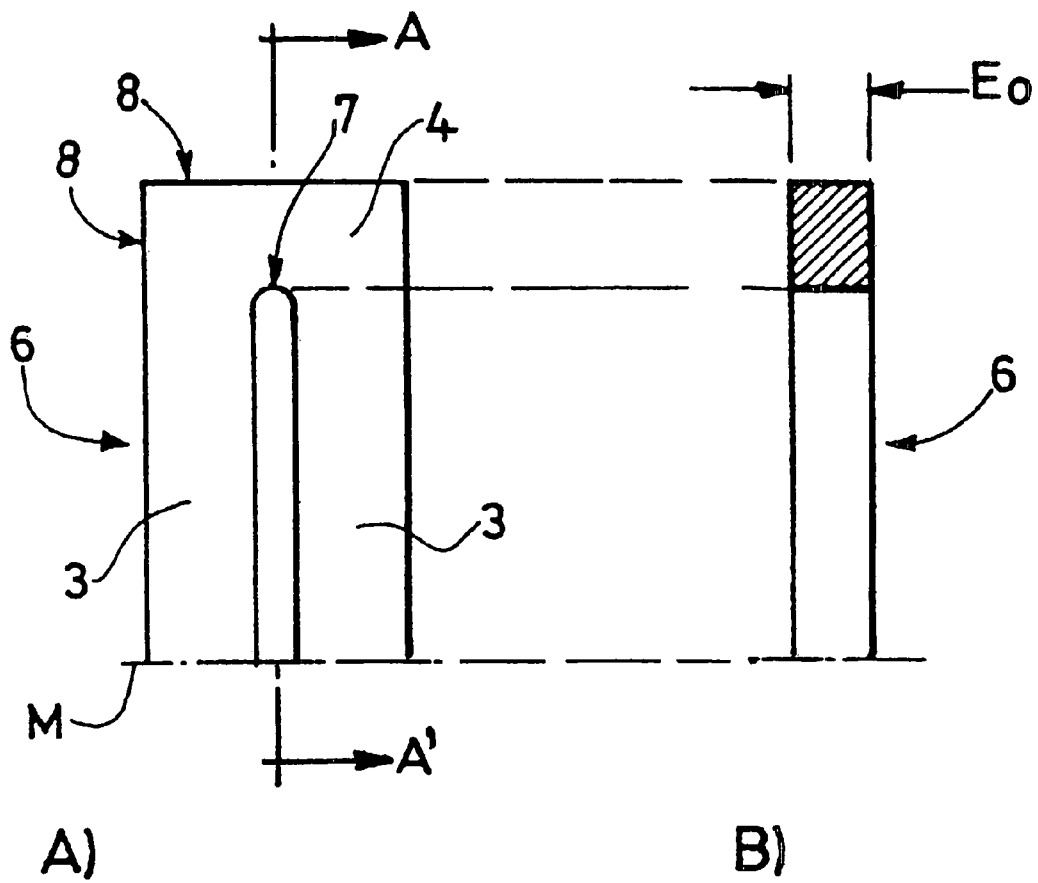
FIG. 2 schematically illustrates an elementary segment of a crenellated resistor according to prior art; front face view (A) and cross sectional view (B).
Figure 3:
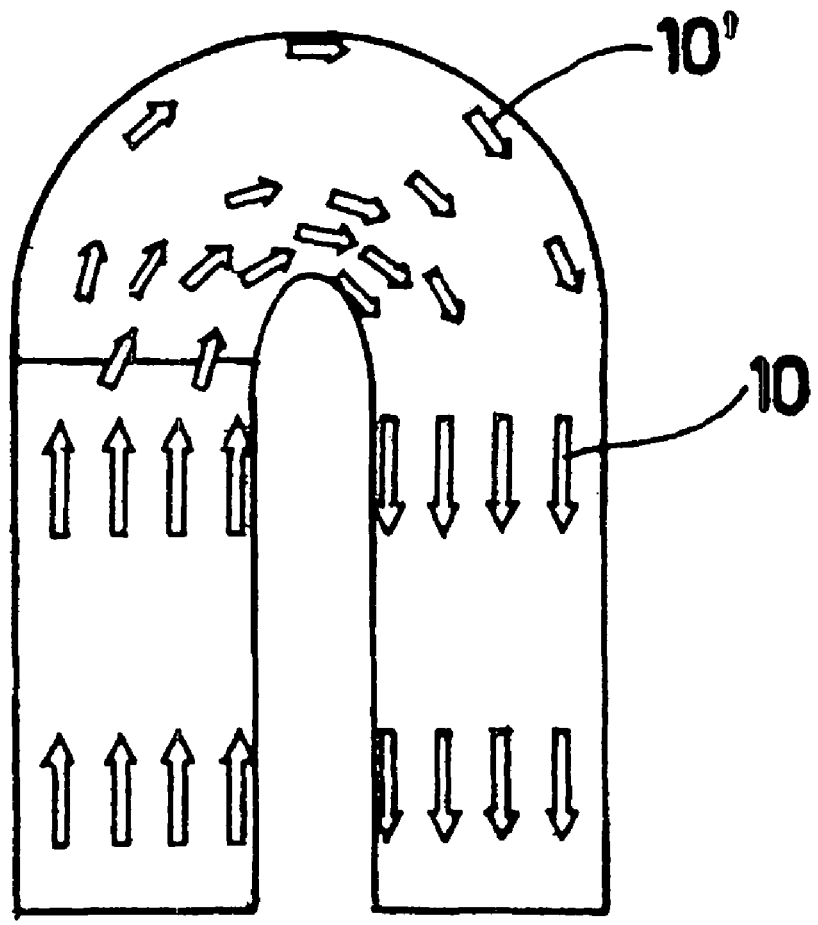
FIG. 3 gives a simplified view of the electric current line distribution into an elementary segment of a crenellated resistor according to prior art.

FIG. 2 exhibits an elementary segment (or meander half) (6) of a crenellated resistor (1), relative to a median line, either seen from the front side (2A) or seen along the cross section A–A' (2B). This elementary segment is repeated along the periphery, alternatively oriented upwards or downwards. The elementary segment typically has two straight <<legs>> (3) and a transition section (or extremity) (4) linking these two straight legs. The extremities (4) of the elementary segments can have a more or less perfectly circular shape. When working, the electric current lines (10) are essentially parallel in the straight legs and gradually change their direction in the transition section (4). FIG. 3 schematically illustrates how the electric current lines (10, 10') are arranged in each elementary segment.

According to the invention, the crenellated resistor (1) made with carbonaceous material has a wall thickness (or <<radial>> thickness) E, which has in the transition sections a profile adapted to produce an even surface temperature when an electric current is flowing through it.

More precisely, the crenellated resistor (1) made with a carbonaceous material according to the invention has the shape of a hollow cylinder whose wall has straight, alternated and regularly spaced slots, which form a path with meanders, each elementary segment (6) of the resistor comprising two straight segments (3) and a transition section (4), the said transition section (4) comprising a peripheral edge (8) and an internal edge (7), and is characterized in that, in order to get an approximately even surface temperature when a current is flowing, the radial thickness E decreases from the peripheral edge (8) to the internal edge (7).

According to the invention, the wall thickness of the crenellated resistor is variable in the extremities of its meanders where the electrical lines are curved, i.e. in the transition sections (4). Said wall "radial" thickness decreases when the radius of the curved electrical line decreases, thus decreases from the peripheral edge (8) to the internal edge (7), in order to distribute more evenly the electrical flow lines.

Preferably, the wall thickness of the crenellated resistor made from a carbonaceous material decreases in a monotonic manner. Practically, said monotonic decrease can be carried out "discontinuously", i.e. by machining "steps" on the surface of the resistor (or on the cavity surface of the mold used for shaping the resistor).

The thickness profile can be defined by a mathematical formula. For instance, the thickness profile seen along a line including C', the center of the circular path followed by the transition section (4) (line T in FIG. 4), could be given by a mathematical function $E(x, \theta)$, where $\theta$ is the angle between the line T and a reference axis (typically the main axis Ao of the elementary segment) and x the distance between the considered point p, located on the line T and the point C'. The profile followed by E is typically a symmetrical function with respect to the main axis Ao of the elementary segment.

The profile of E can be experimentally determined, or through some calculations (specially finite element calculations) or through a mathematical simulation. The surface temperature is linked to the radiated power it emits while working. The inventor has found that the thickness profile could be simply determined through a calculation of the power $p_o$ dissipated through the Joule effect into any unit of volume of the resistor, assuming that every element of the surface will receive a power equal to the sum of the electric power dissipated in each the volume units ($p_o$) located beneath it, and will then transfer it into its environment. With this principle, the thickness profile of the transition section (4) could be determined in a such a way that the electrical power produced by unit of surface is approximately the same whatever the surface unit considered.

In a more detailed way, the thickness profile could be determined by assuming that in a steady state situation the power dissipated by each surface unit is equal to the electric power Po dissipated below the same surface unit and using the equation $Po = \Delta U^2/(R \times S)$, where $\Delta U$ is the difference of electric potential between the two extremities of a given surface unit, R the electrical resistance between these two extremities and S the area of the surface unit.

Figure 4:
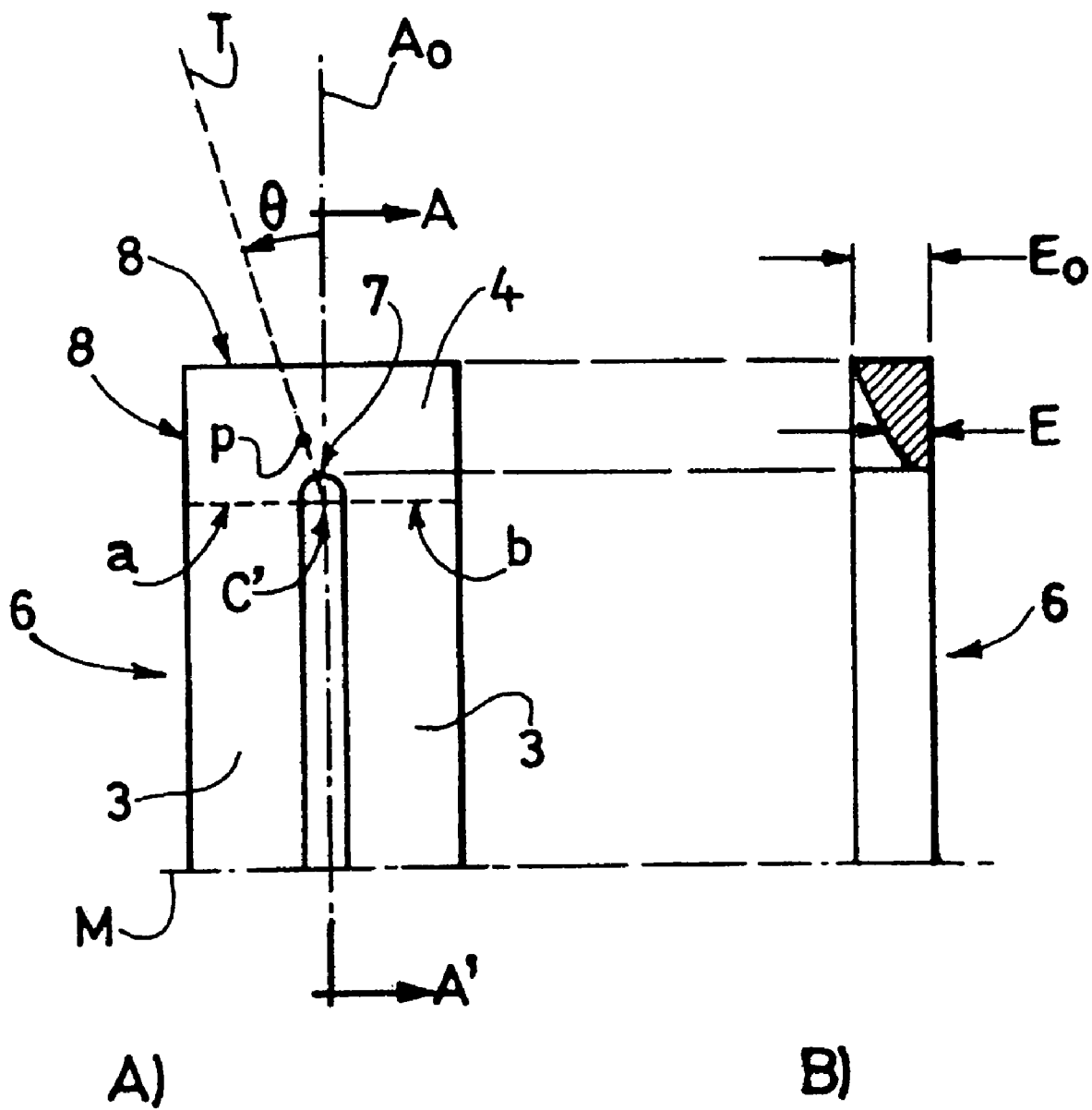
FIG. 4 illustrates an elementary segment of a crenellated resistor made according to the principles of this invention; front face view (A) and cross sectional view (B).

The value of Po can be calculated using the following simplified formulas:

$$\Delta U = Ua - Ub, \quad R = \pi r \rho/(e \times dr) \text{ and } S = \pi r \times dr,$$

where Ua and Ub are the two equipotential lines <<a>> and <<b>> shown on the FIG. 4, respectively, ρ is the resistivity of the carbonaceous material and r, e, dr are the average radius of the transition section around the center C', the thickness and the width of each infinitesimal step i, respectively. The power Po, by unit of surface is then given by: $Po = (Ua - Ub)^2 \times e/(\rho \pi^2 r^2)$. The profile can be calculated with the objective that the power dissipated by each "step" is equal to the same value, whatever the step considered. When ρ has an even value throughout the material, which is generally the case, it does not interfere with the profile calculation.

The thickness profile is such that the thickness of the transition section (4) is the largest (i.e. thickest) close to the peripheral edge (8) of the said section, and the smallest (i.e. thinnest) close to the internal edge (7), i.e. close from the center C' of the said section. Such a configuration allows to get a more homogeneous surface temperature with a negligible impact on the mechanical strength of the transition section. In a simplified version the profile is such that the thickness E decreases steadily between the peripheral edge (8) and the internal edge (7) of the transition section (4).

It has been found advantageous enough to use a variation of the invention according to which the thickness varies discontinuously, with "steps", between the peripheral edge (8) and the internal edge (7) of the transition section (4). In other terms, the thickness profile comprises a limited number of sections, each of them being characterized by a uniform thickness (E1, E2, . . . ) but different for each section or each "step" (M1, M2, . . . ). The width (L1, L2, . . . ) of each step could vary. The thickest part is normally located at the peripheral edge (8), which allows to keep high mechanical characteristic. This variation greatly simplifies the fabrication of the resistor according to the invention.

Figure 5:
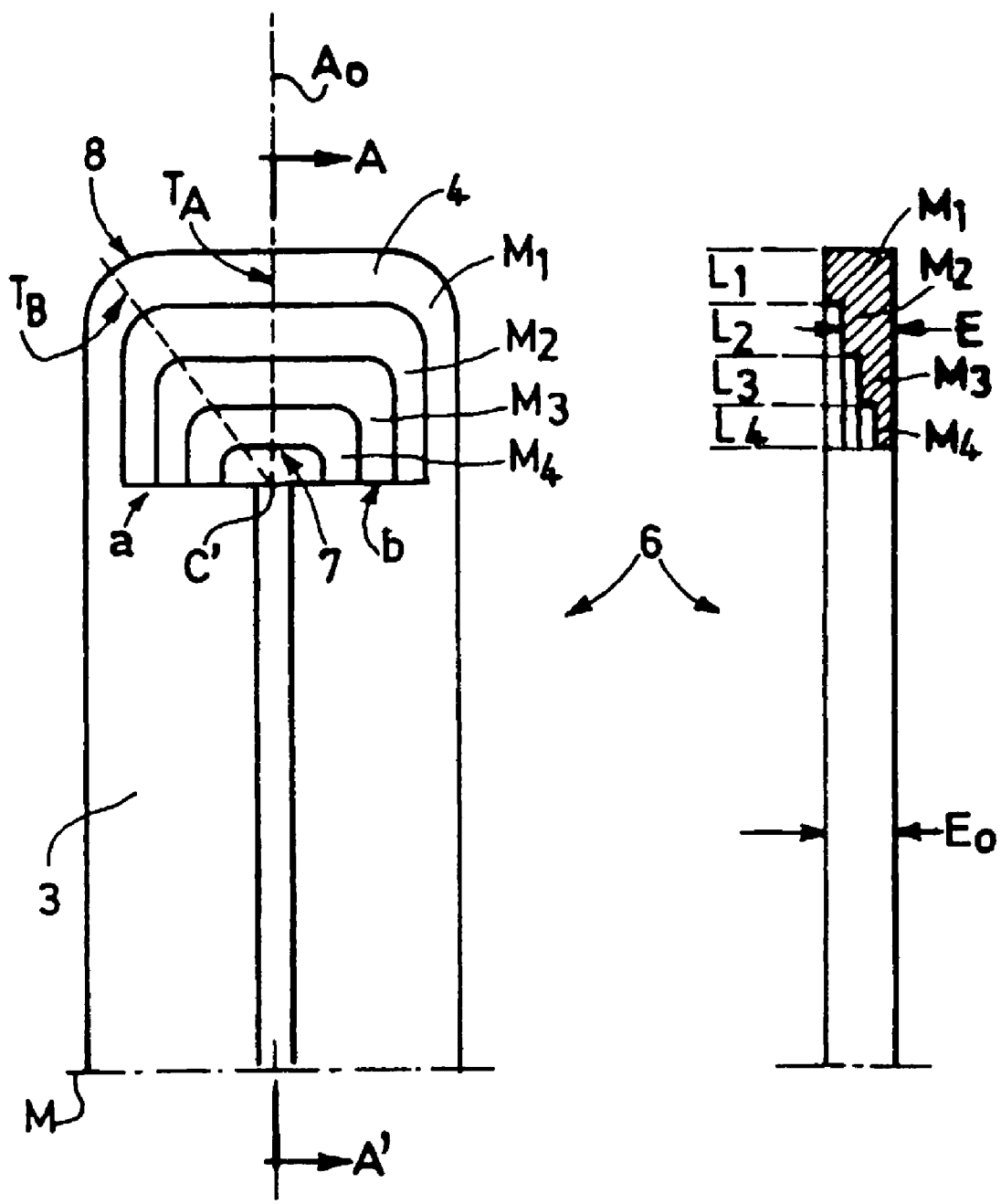
FIG. 5 schematically illustrates an elementary segment of a crenellated resistor made according to a preferred embodiment of this invention; front face view (A) and cross sectional view (B).

FIG. 5 illustrates a resistor according to this preferred variation of the invention. The A–A' cross section of the FIG. 5A (seen in FIG. 5B) shows a step by step decrease of the thickness from the peripheral edge (8) to the internal edge (7) of the transition section (4). According to this embodiment, the thickness profile has a similar shape for all the lines To, Tb, . . . included between the lines <<a>> and <<b>> and the thickness is approximately steady in each straight section (3). The profile could be symmetrical relative to the plane which contains the transition section. The fabrication is easier with an asymmetric profile as illustrated in FIG. 5B, where one of the faces of the transition section is flush with one of the faces of straight legs (3).

The thickness profile according to this preferred variation can be calculated using the mathematical formulas proposed above. The steps "i" have then a finite width (L1, L2 . . . ) which is typically between 1 and 20 mm. The number steps is limited, typically between 3 and 10 steps. Too low a number does not allow to get the desired homogeneity, too high a number leads to excessive production costs of the crenellated resistor.

The thickness in the straight sections (or "legs") is typically between 5 and 40 mm. In this preferred variation of the invention, in transition sections, the thicker part of the profile is typically between 25 and 40 mm. The thinner part, located next to the internal edge (7) has a thickness which is 2 to 10 times smaller (typically approximately 5 times lower) than the thickness of the thickest area located next to the peripheral edge (8) of the transition section.

It has also been found that, in order to achieve a good temperature homogeneity, it is not mandatory to have thickness variations anywhere else than in the transition sections (improvement brought with a varying thickness in the straight sections (3) are negligible). In the embodiment illustrated in the FIG. 5 the height of the step between the transition section and the straight leg increases stage by stage from the peripheral edge to the internal edge. The inventor noticed that a smoother variation of the thickness between the transition section and the straight leg had little influence on the distribution of the electrical flow lines and that the resulting slightly improved mechanical strength was not worth it when compared with the additional cost resulting from the machining necessary to obtain such smooth surfaces.

The peripheral edge (8) and internal edge (7) can be in whole or in part straight or arcuated. They can also include some flat or curved portions.

The inventor has determined, through a finite element calculation giving the distribution of the lines of electric flow, the amount of power dissipated per unit area (i.e. the power received and emitted by each surface unit) in the transition sections of a crenellated resistor according to prior art with a uniform wall thickness, and found that the ratio between the largest and the lowest values of the power dissipation densities is more than 200 over the surface of a transition section (typically between 50 $\mu W/mm^2$ à 15 $mW/mm^2$). It has also found, with the same calculation principles, that in similar conditions the ratio between the largest and the lowest values of the power dissipation densities is no more than 10, or even no more than 5, when the transition sections are made according to the invention with a thickness profile comprising only 4 steps with 4 different thicknesses. A profile with 10 steps allows to keep this ratio between the highest and lowest local power below 3.

The carbonaceous material can be selected among the group comprising graphite materials, carbon materials and carbon/carbon composite materials.

The crenellated resistor according to the invention can be produced by any known technique used to manufacture parts or items from carbonaceous materials. Typically, the production process for manufacturing a one-piece crenellated resistor includes:

the production of a hollow cylinder whose wall thickness has a uniform value, machining operations (including if necessary drilling, cutting, carving) of the wall of the cylinder so as to get the desired meanders and the desired thickness profiles.

The hollow cylinder can be produced from a plain cylinder through some drilling, coring, or cutting operations, or any other means.

The resistor can be made starting with a green block or cylinder and performing at least one heat treatment step within the process.

What is claimed is:

1. A crenellated resistor made from a carbonaceous material and shaped as a hollow cylinder having a wall including a plurality of straight slots, said slots being alternated and regularly spaced to form a meander-like contour, said wall being thereby formed into a plurality of elementary segments, each of said elementary segments including two substantially straight legs and a transition section therebetween having a peripheral edge and an internal edge,
wherein each said transition section has a thickness which decreases monotonically from the peripheral edge to the internal edge, and each of said straight legs has a thickness which is substantially constant,
whereby electric flow through the resistor results in a substantially even surface temperature.

2. The resistor of claim 1, wherein the thickness in the transition section decreases in steps of uniform thickness.

3. The resistor of claim 2, wherein the number of said steps is between 3 and 10.

4. The resistor of claim 2, wherein each transition section has a thickness adjacent the internal edge which is 2–10 times smaller than the thickness adjacent the peripheral edge.

5. The resistor of claim 1, wherein said carbonaceous material is selected from the group consisting of graphite materials, carbon materials and carbon/carbon composite materials.

6. The resistor of claim 1, which is a one piece crenellated resistor.

7. The resistor of claim 1, wherein the thickness in the transition section has an asymmetrical profile, with one face in the transition section being flush with a face of the straight legs.

8. A furnace suitable for the growth of silicon monocrystals and including at least one crenellated resistor according to claim 2.

* * * * *